United States Patent
Tsai et al.

(10) Patent No.: US 6,365,228 B1
(45) Date of Patent: Apr. 2, 2002

(54) PROCESS FOR SPIN-ON COATING WITH AN ORGANIC MATERIAL HAVING A LOW DIELECTRIC CONSTANT

(75) Inventors: Cheng-Yuan Tsai, Yunlin Hsien; Ming-Sheng Yang, Hsinchu; Chin-Hsiang Lin, Nantou Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/685,430

(22) Filed: Oct. 10, 2000

(30) Foreign Application Priority Data

Sep. 14, 2000  (TW) .......................................... 89118784

(51) Int. Cl.⁷ ................................................. B05D 3/12
(52) U.S. Cl. ..................... 427/240; 427/307; 427/309; 427/419.1; 427/419.2; 427/419.3; 427/419.7; 427/309.7; 427/397.7
(58) Field of Search .............................. 427/240, 207.1, 427/208.8, 307, 309, 419.1, 419.2, 419.3, 419.7, 397.7, 385.538, 389.7; 118/52

(56) References Cited

U.S. PATENT DOCUMENTS

| 5,194,928 A | * | 3/1993 | Cronin et al. ................ 257/629 |
| 5,874,202 A | * | 2/1999 | Orth ............................. 430/327 |
| 5,965,679 A | * | 10/1999 | Godschalx et al. ......... 526/281 |
| 6,166,439 A | * | 12/2000 | Cox ............................. 257/758 |

* cited by examiner

Primary Examiner—Shrive P. Beck
Assistant Examiner—Jennifer Calcagni
(74) Attorney, Agent, or Firm—Thomas, Kayden, Horstemeyer & Risley

(57) ABSTRACT

A process for spin-on coating with an organic material having a low dielectric constant, which is suitable for a substrate. A dielectric base layer capable of protecting metal is formed on the substrate, an adhesive promoter layer is formed on the dielectric base layer, and the adhesive promoter layer is baked. A solvent is then used to clean the substrate and simultaneously to dissolve a part of the adhesive promoter layer in order to flatten the adhesive promoter layer. Afterwards, a layer of an organic material with a low dielectric constant is spin-on coated on the adhesive promoter layer, and the layer of an organic material with a low dielectric constant is baked and cured.

11 Claims, 3 Drawing Sheets

PROCESS FOR SPIN-ON COATING WITH AN ORGANIC MATERIAL HAVING A LOW DIELECTRIC CONSTANT

CROSS-REFERENCE TO RELATED APPLICATION

This application claims the priority benefit of Taiwan application serial no. 89118784, filed Sep. 14, 2000.

BACKGROUND OF THE INVENTION

1. Field of the Invention

The present invention relates to a process for forming a dielectric layer in a semiconductor process. More particularly, the present invention relates to a process for spin-on coating with an organic material having a low dielectric constant.

2. Description of the Related Art

With the constant narrowing of semiconductor line width, super large-scaled integrated circuit wafers with high speed, multifunction, high degree of integration, low power consumption and low cost are produced in large quantities. With the increase of microminiaturization and the integration degree of components, the density of interconnects is also constantly increasing. As a result, the problem of resistance and capacitance delay (RC Delay) of components is becoming increasingly serious, and the speed of components is reduced. Therefore, if insulating layers of lower dielectric constant are formed between multi-layered interconnects, the parasitic capacitance between conducting wires can be effectively reduced and the operating speed of components can be increased. Most low dielectric constant materials are organic materials with low dielectric constants whose molecules can catenate one after another to form organic macromolecules with low dielectric constants.

Of all the processes for forming a layer with an organic material of a low dielectric constant, the most commonly adopted one is spin-on coating. The process includes steps as follows: first, a solution of an organic material with a low dielectric constant is prepared. Then, a fast spinning wafer is coated with the solution. Finally, a baking and curing step is conducted on the layer with an organic material of a low dielectric constant. However, the solution in this process is not coated directly on metal wires, because formation of the plugs connected to the metal wires would be affected if the solution were coated directly on the metal wires. Therefore, after the metal wires are fabricated, a dielectric base layer capable of protecting the metal layer is formed on the metal wires. The materials for the dielectric base layer can be, for example, silicon carbide (SiC), silicon nitride (SiN) or other inorganic materials. The layer of an organic material with a low dielectric constant is spin-on coated on the dielectric base layer.

However, the adhesive power between organic materials with low dielectric constants and the inorganic dielectric base layer is not strong. Therefore, before coating on the solution of an organic material with a low dielectric constant, a layer of adhesive promoter (AP) is usually first coated onto the inorganic dielectric base layer so as to increase the adhesive power between the organic material with a low dielectric constant and the inorganic dielectric base layer. The commonly used adhesive promoters are chemical reactive adhesives, which can have chemical bounding with the low dielectric constant organic materials and the dielectric base layer, respectively. The layer of adhesive promoter strengthens the connection between the organic materials having a low dielectric constant and the inorganic dielectric base layer.

FIG. 1 shows a conventional process of spin-on coating with an organic material of a low dielectric constant. As is shown in FIG. 1, a substrate 100 is provided, a dielectric base layer 110 capable of protecting metal is then formed on the substrate 100 and a layer 120 of adhesive promoter is coated on the dielectric base layer 110, baked and cured. There are some problems in the conventional process for spin-on coating with organic materials of low dielectric constants. First, the surface of the adhesive promoter layer 120 that is coated on the dielectric base layer 110 is often lumpy, so when a highly viscous solution of organic materials with low dielectric constants 130 is spin-on coated on the adhesive promoter layer 120, the bulging parts on the surface of the adhesive promoter layer 120 obstruct the flow of the solution of the organic materials with low dielectric constants 130. As a result, the lumpiness on the surface of the organic material layer 130 is even more serious than that on the adhesive promoter layer 120, as shown in FIG. 1. The lumpiness further affects the lithography process on each of the ensuing wafer layers. Second, because it is not easy to reduce the coating thickness of the adhesive promoter layer 120 in the conventional technology (usually, the thickness range is between about 100 angstroms and 150 angstroms), and because the polarity and the dielectric constant of the adhesive promoter 120 are higher than those of those organic materials with low dielectric constants in the layer 130, the problem of a total dielectric constant increase is caused. Third, because the cohesive force of the adhesive promoter layer 120 is less than the adhesive force between the dielectric base layer 110 and the layer of the organic materials with low dielectric constants 130, the over-thickness of the adhesive promoter layer 120 reduces the adhesive force of the layer of the organic materials with low dielectric constants 130. Fourth, when the thickness of the adhesive promoter layer 120 is not uniform, since the etching rate of the adhesive promoter layer 120 is small, the adhesive promoter layer 120 and the dielectric base layer 110 cannot be entirely removed in a subsequent step. For example, as shown in FIG. 2, during the dual damascene process, the adhesive promoter layer 120 and the dielectric base layer 110 is removed by dry etching. While forming a via hole 135 in the thicker portion of the adhesive promoter layer 120, because the etching rate of the adhesive promoter layer 120 is so slow, the adhesive promoter layer 120 and the dielectric base layer 110 are not easily removed.

SUMMARY OF THE INVENTION

The invention provides a process for spin-coating with an organic material having a low dielectric constant, which can solve the problems in the conventional technology, that is, the problems of lumpiness of the layer of an organic material with a low dielectric constant, of total increase of the dielectric constant, and of the lowering of the adhesive force of the layer of an organic material with a low dielectric constant. The present process is suitable for a substrate. The process is performed as follows: first, a dielectric base layer capable of protecting metal is formed on the substrate. Then an adhesive promoter layer is formed on the dielectric base layer, and is then properly baked. Then a solvent is used to clean the substrate and to dissolve a part of the adhesive promoter layer so as to flatten the adhesive promoter layer. Afterwards, a layer of an organic material with a low dielectric constant is spin-coated onto the adhesive promoter layer, and finally the layer of an organic material with a low dielectric constant is baked and cured.

As described above, because the present invention uses a solvent that can dissolve part of the adhesive promoter layer so as to flatten the layer after it is coated on top of the dielectric base layer and is baked, it has advantages as follows. First, because the adhesive promoter layer is flattened, the extent of lumpiness on the surface of the layer of an organic material with a low dielectric constant that is spin-on coated on the adhesive promoter layer is largely reduced. Thus, the lithography process on each of the ensuing wafer layers is not affected. Second, the solvent dissolves a part of the adhesive promoter layer, which has a relatively higher dielectric constant, the thickness of the layer is reduced, and consequently, the total dielectric constant is lowered. Third, because the solvent dissolves a part of the adhesive promoter layer, whose cohesive force is lower than its adhesive force, the adhesive promoter layer becomes thinner and thus the adhesive force between the layer of an organic material with a low dielectric constant and the dielectric base layer is increased. Forth, the present forms an adhesive promoter layer having a more uniform thickness, the adhesive promoter layer has no overly thick portion. In a subsequent etching step, the fabrication process can be better controlled to completely remove the adhesive promoter layer and the dielectric base layer. Thus, the upper metal layer and the lower metal layer can be successfully connected.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the above described objects, characteristics and advantages of the invention, and are incorporated in and constitute a part of this specification. The drawings illustrate a preferred embodiment of the invention and, together with the description, serve to explain the principles of the invention. In the drawings.

DESCRIPTION OF THE PREFERRED EMBODIMENTS

Figure 1:
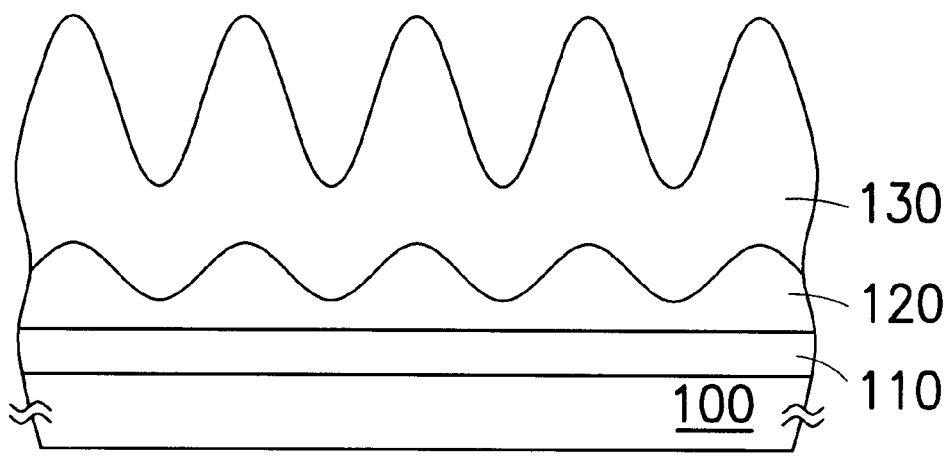
FIG. 1 shows the conventional process for spin-on coating with an organic material having a low dielectric constant.
Figure 2:
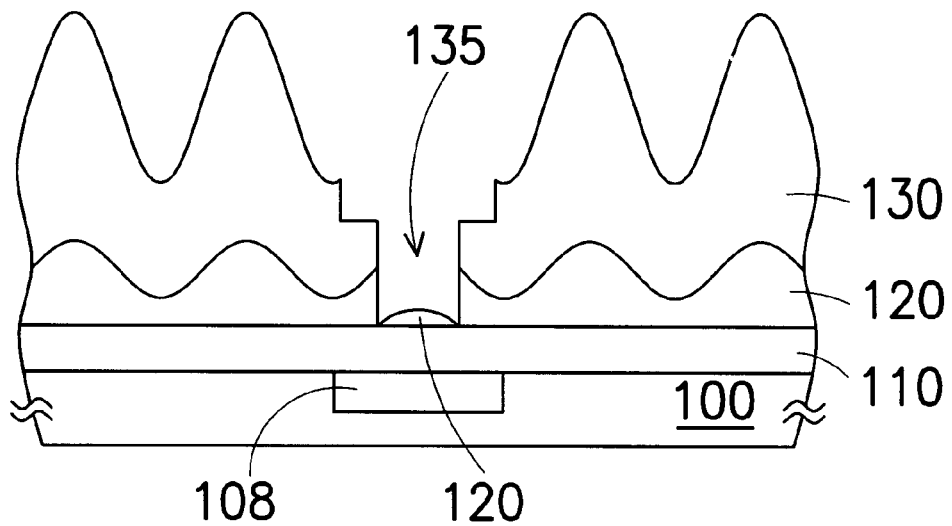
FIG. 2 shows a via hole formed in a dual damascene fabrication process by etching an adhesive promoter layer having an non-uniform thickness.
Figure 3A:
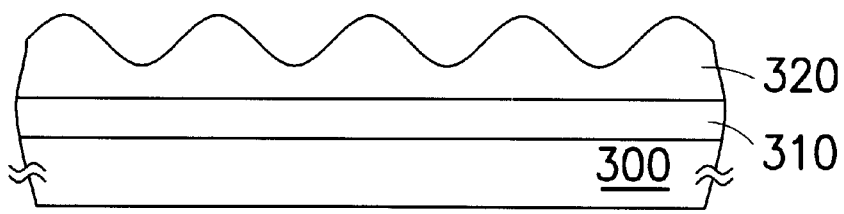
FIG. 3A to FIG. 3C show the process for spin-on coating with an organic material of having low dielectric constant according to the preferred embodiment of the present invention.

Reference is made to FIG. 3A. A substrate 300 is provided, on which a dielectric base layer 310 capable of protecting metal is already formed. The materials for the dielectric base layer 310 are, for example, inorganic insulating materials, which include silicon nitride, silicon carbide, silicon oxynitride, silicon oxide, and so on. Then an adhesive promoter layer 320 is coated on the dielectric base layer 310. The material for the adhesive promoter layer 320 is, for example, AP4000 produced by Dow Chemicals.

Afterwards, the adhesive promoter layer 320 is baked. The baking temperature is about 90° C. to 200°, and the baking time is about 30 seconds to 180 seconds. The average thickness of the adhesive promoter layer 320 after the baking is about 150 angstroms.

Figure 3B:
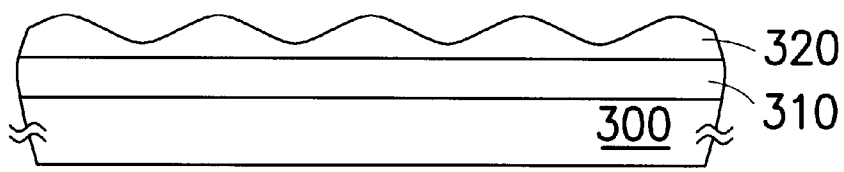

Reference is made to FIG. 3B. After the steps described in FIG. 3A, a solvent is used to clean the substrate 300 and to dissolve a part of the adhesive promoter layer 320 in order to flatten the adhesive promoter layer 320. The solvent is, for example, T2200 produced by Dow Chemicals, whose main component is mesitylene, propylene glycol methylether acetate (PGMEA) or γ-butyrolactone. After the solvent dissolves a part of the adhesive promoter layer 320, the average thickness of the layer is smaller than 100 angstroms.

Figure 3C:
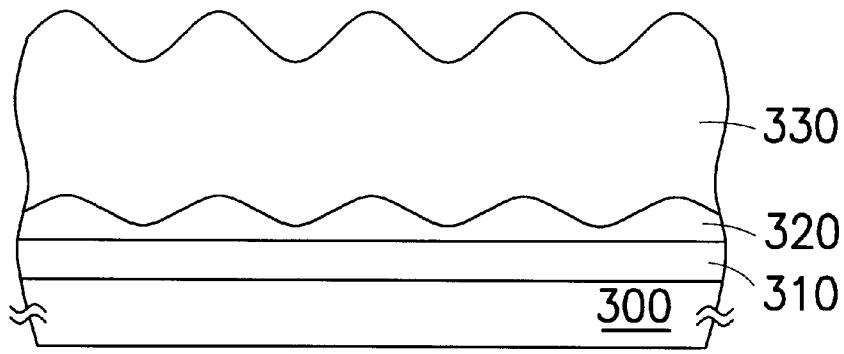

Reference is made to FIG. 3C. After the steps described above, the layer 330 of an organic material with a low dielectric constant is spin-on coated on the adhesive promoter layer 320. The material is, for example, aromatic hydrocarbon material sold under the trademark SiLK or FLARE. Finally, the layer 330 of organic material with a low dielectric constant is baked and cured, and the process for coating with an organic material of a low dielectric constant is complete.

As described above, in the preferred embodiment of the present invention, a solvent that can dissolve the adhesive promoter layer 320 is used to flatten the layer 320, after the layer 320 is coated on the dielectric base layer 310 and is baked. Therefore, the extent of lumpiness on the surface of the layer 330 of an organic material with a low dielectric constant that is coated on the adhesive promoter layer 320 can be largely reduced, and the ensuing lithography or etching process on each of the wafer layers is not affected.

In addition, the adhesive promoter layer 320 has higher a dielectric constant, so when the solvent dissolves a part of the layer 320 to make it thinner, the total dielectric constant is lowered. Furthermore, the cohesive force of the adhesive promoter layer 320 is lower than its adhesive force, so when the solvent dissolves a part of the adhesive promoter layer 320 to make it thinner, the adhesion between the layer 330 of an organic material with a low dielectric constant and the dielectric base layer 310 is increased.

Figure 4:
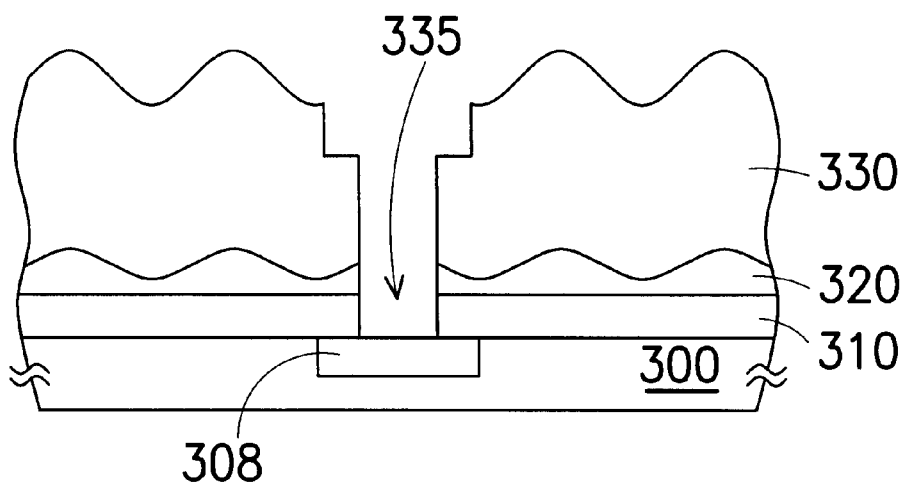
FIG. 4, shows a via hole formed in a dual damascene fabrication process by etching an adhesive promoter layer having a uniform thickness.

As shown in FIG. 4, in the preferred embodiment of the present invention, the thickness of the treated adhesive promoter layer 320 is uniform. No overly thick portion of the promoter layer 320 is formed. In the dual damascene fabrication process, while forming a via hole 335 in the adhesive promoter layer 320 and dielectric base layer 310, the adhesive promoter layer 320 and dielectric base layer 310 in the via 335 can be completely removed. Thus, the metal layer 308 and a metal layer formed thereon can be successfully connected.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for spin-coating with an organic material having a low dielectric constant, comprising:

forming a dielectric base layer on a substrate;

forming an adhesive promoter layer on the dielectric base layer;

baking the adhesive promoter layer to a predetermined thickness;

cleaning the substrate with a solvent, wherein a part of the adhesive promoter layer is dissolved to flatten the adhesive promoter layer;

spin-coating an organic material layer having a low dielectric constant onto the flattened adhesive promoter layer; and baking and curing the organic material layer having a low dielectric constant.

2. The method of claim 1, wherein the material for the dielectric base layer is an inorganic insulating material.

3. The method of claim 2, wherein the inorganic insulating material layer is silicon nitride, silicon carbide, silicon oxynitride, or silicon oxide.

4. The method of claim 1, wherein a temperature for baking the adhesive promoter layer is between about 90° C. and 200° C.

5. The method of claim 1, wherein time for baking the adhesive promoter layer is between about 30 seconds and 120 seconds.

6. The method of claim 1, wherein an average thickness of the adhesive promoter layer after baking is about 150 angstroms.

7. The method of claim 1, wherein an average thickness of a remaining adhesive promoter layer after dissolving by the solvent is smaller than 100 angstroms.

8. The method of claim 1, wherein the solvent includes mesitylene.

9. The method of claim 1, wherein the solvent includes propylene glycol methylether acetate (PGMEA).

10. The method of claim 1, wherein the solvent includes γ-butyrolactone.

11. The method of claim 1, wherein a material for the layer of an organic material with a low dielectric constant includes an aromatic hydrocarbon material.

* * * * *